(12) United States Patent
Lee et al.

(10) Patent No.: US 12,215,974 B2
(45) Date of Patent: Feb. 4, 2025

(54) OPTICAL MEASUREMENT APPARATUS, MEASURING METHOD USING THE SAME, AND METHOD FOR FABRICATING SEMICONDUCTOR DEVICE USING THE SAME

(71) Applicant: Samsung Electronics Co., Ltd., Suwon-si (KR)

(72) Inventors: Seung Woo Lee, Seoul (KR); Wook Rae Kim, Suwon-si (KR); Kwang Soo Kim, Osan-si (KR); Myung Jun Lee, Seongnam-si (KR); Seo Yeon Jeong, Yongin-si (KR); Sung Ho Jang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 205 days.

(21) Appl. No.: 17/969,200

(22) Filed: Oct. 19, 2022

(65) Prior Publication Data
US 2023/0184535 A1  Jun. 15, 2023

(30) Foreign Application Priority Data
Dec. 15, 2021 (KR) .......................... 10-2021-0179788

(51) Int. Cl.
*G01B 9/02055* (2022.01)
*G01B 9/02* (2022.01)
(Continued)

(52) U.S. Cl.
CPC ...... *G01B 9/02063* (2013.01); *G01B 9/02011* (2013.01); *G01B 9/0203* (2013.01);
(Continued)

(58) Field of Classification Search
CPC ............ G01B 9/02063; G01B 9/02011; G01B 9/0203; G01B 9/02083; G01B 2290/70;
(Continued)

(56) References Cited

U.S. PATENT DOCUMENTS 5,298,971 A * 3/1994 Huang ................. G01B 11/255
356/520
5,452,382 A * 9/1995 Shionoya ........... G02B 21/0056
385/11
(Continued)

FOREIGN PATENT DOCUMENTS

JP H08213306 A 8/1996
JP 2006073932 A 3/2006
(Continued)

*Primary Examiner* — Jonathan M Hansen
(74) *Attorney, Agent, or Firm* — Muir Patent Law, PLLC

(57) ABSTRACT

A optical measurement apparatus includes: an optical system which generates a pupil image of a measurement target, using light; a polarization generator which generates a polarized light from the light; a self-interference generator which generates a plurality of beams divided from the pupil image, using the polarized light, and causes the plurality of beams to interfere with each other to generate a self-interference image; and an image analysis unit configured to extract phase data from the self-interference image, and to move the measurement target to a focus position on the basis of the phase data.

20 Claims, 10 Drawing Sheets

(51) Int. Cl.
  *G01B 9/02001* (2022.01)
  *G01B 9/02015* (2022.01)
  *H01L 21/66* (2006.01)
(52) U.S. Cl.
  CPC ...... *G01B 9/02083* (2013.01); *G01B 2290/70* (2013.01); *H01L 22/12* (2013.01)
(58) Field of Classification Search
  CPC ..... G01B 9/02098; H01L 22/12; H01L 22/30; G01N 21/9501; G01N 21/956; G01N 21/01; G01N 21/95; G01N 21/8806; G01N 21/41; G01N 21/8851; G01N 2021/4173; G01N 2021/8845; G01N 2021/8848; G01N 2021/8887
  See application file for complete search history.

(56) References Cited

U.S. PATENT DOCUMENTS

| | | | |
|---|---|---|---|
| 5,825,469 A | | 10/1998 | Nam et al. |
| 5,956,141 A | * | 9/1999 | Hayashi ............. G01B 11/2441 356/511 |
| 7,700,903 B2 | | 4/2010 | Weiss et al. |
| 2020/0319443 A1 | * | 10/2020 | Liu ...................... G02B 21/006 |
| 2022/0074848 A1 | * | 3/2022 | Jung ................... G01N 21/211 |
| 2023/0000343 A1 | * | 1/2023 | Kim .................... G03F 7/70625 |

FOREIGN PATENT DOCUMENTS

| | | |
|---|---|---|
| JP | 2010112803 A | 5/2010 |
| KR | 10-1998-0050456 A | 9/1998 |
| KR | 10-1924888 B1 | 12/2018 |

\* cited by examiner

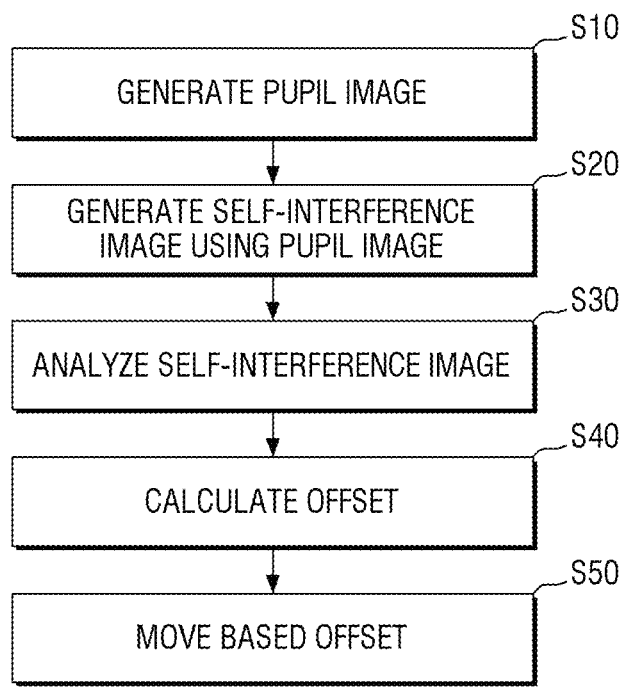
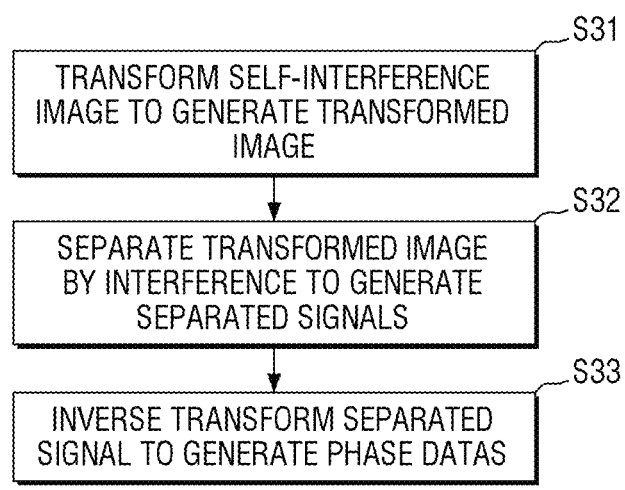

OPTICAL MEASUREMENT APPARATUS, MEASURING METHOD USING THE SAME, AND METHOD FOR FABRICATING SEMICONDUCTOR DEVICE USING THE SAME

CROSS-REFERENCE TO THE RELATED APPLICATION

This application is based on and claims priority to Korean Patent Application No. 10-2021-0179788 filed on Dec. 15, 2021, in the Korean Intellectual Property Office, the disclosure of which is incorporated herein in its entirely by reference.

BACKGROUND

1. Field of the Disclosure

The present disclosure relates to an optical measurement apparatus, an optical measuring method using the same, and a method for fabricating a semiconductor device using the same.

2. Description of the Related Art

As a semiconductor process becomes finer, more precise measurements are required. Accordingly, various non-contact and non-destructive measurement methods using an optical system, such as a bright field illumination system inspection device, a dark field illumination system inspection device, interferometry, reflectometry, and ellipsometry, have been proposed.

In such a measuring method using an optical system, an autofocus technique for searching for an accurate focal position is a technique frequently used for a measurement technique using an optical system. Because inaccurate autofocus may deteriorate measurement precision and accuracy, an accurate and precise autofocus technique is desired.

SUMMARY

Aspects of the present disclosure provide a method for fabricating a semiconductor device, using an optical measurement apparatus and an optical measuring method.

Aspects of the present disclosure also provide an optical measurement apparatus having improved or enhanced sensitivity of auto-focusing.

Aspects of the present disclosure also provide an optical measuring method having improved or enhanced sensitivity of auto-focusing.

Aspects of the present disclosure also provide an optical measurement apparatus and an optical measuring method having improved or enhanced versatility capable of performing auto-focusing without being influenced by a sample.

According to an aspect of an example embodiment, a method for fabricating a semiconductor device includes: generating a pupil image of a measurement target, using light; generating a polarized light from the light; generating a plurality of beams divided from the pupil image, using the polarized light; causing the plurality of beams to interfere with each other to generate a self-interference image; extracting phase data from the self-interference image; moving the measurement target to a focus position on the basis of the phase data; and based on the moving, performing a semiconductor process on the measurement target.

According to an aspect of an example embodiment, an optical measurement apparatus includes a light source which generates light; an optical system which generates a pupil image of a measurement target using the light; a polarization generator which generates a polarized light from the light; a self-interference generator which generates a plurality of beams divided from the pupil image, using the polarized light; a detector which detects a self-interference image generated by the plurality of beams interfering with each other; and an image analysis unit configured to extract phase data from the self-interference image and adjust a distance between the measurement target and the optical system on the basis of the phase data.

According to an aspect of an example embodiment, an optical measurement apparatus includes: a light source which generates light including a broadband light; a beam splitter which makes the light incident on a measurement target, and emits any one of light reflected from the measurement target, light transmitted from the measurement target, and light refracted from the measurement target; an objective lens which condenses the light from the measurement target and generates a pupil image of the measurement target from the light from the measurement target; a wavelength selector which outputs at least one monochromatic light from the light from the measurement target; a polarization generator which polarizes the monochromatic light in a first direction to generate a polarized light; a self-interference generator which includes a beam displacer that generates a plurality of beams divided from the pupil image by the use of the polarized light, and an analyzer that polarizes the plurality of beams in a second direction; a detector which detects a self-interference image generated by the plurality of beams interfering with each other; and an image analysis unit configured to extract a phase difference from the self-interference image, and adjust a distance between the measurement target and the objective lens on the basis of the phase difference.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

These and other aspects and features of the present disclosure will become more apparent by describing in detail exemplary embodiments thereof with reference to the attached drawings, in which:

FIG. 9 is an exemplary flowchart for explaining the optical measuring method according to some embodiments;

FIG. 10 is an exemplary flowchart for explaining a step of analyzing the self-interference image in the optical measuring method according to some embodiments;

DETAILED DESCRIPTION OF THE EMBODIMENTS

Figure 1:
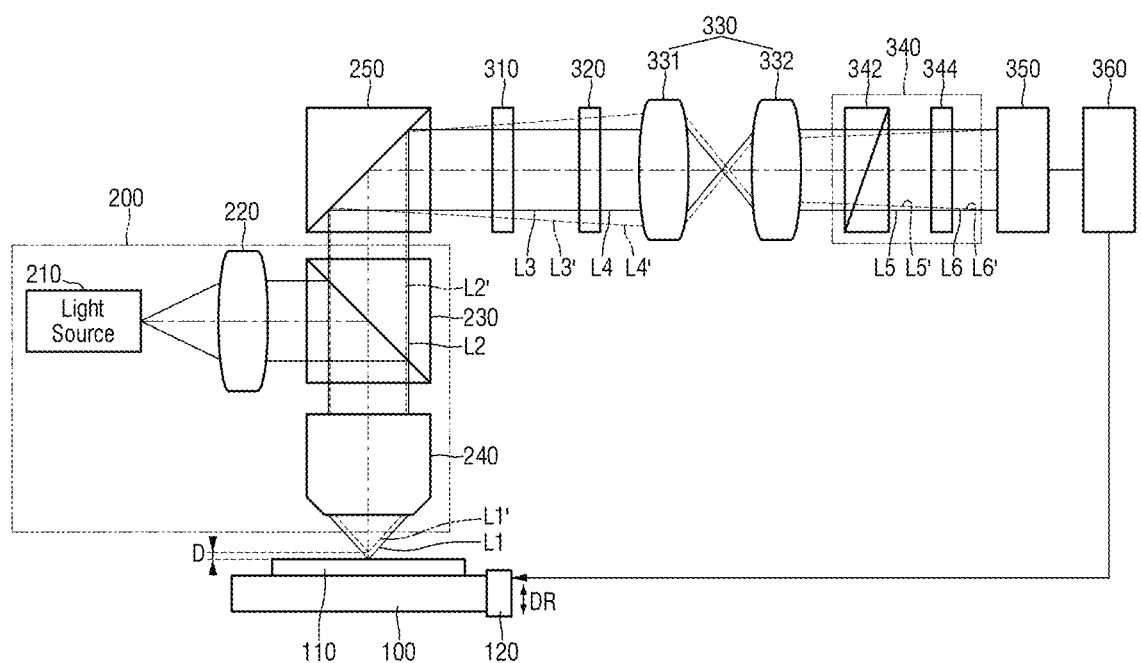
FIG. 1 is a schematic conceptual diagram for explaining an optical measurement apparatus according to some embodiments.
Figure 2:
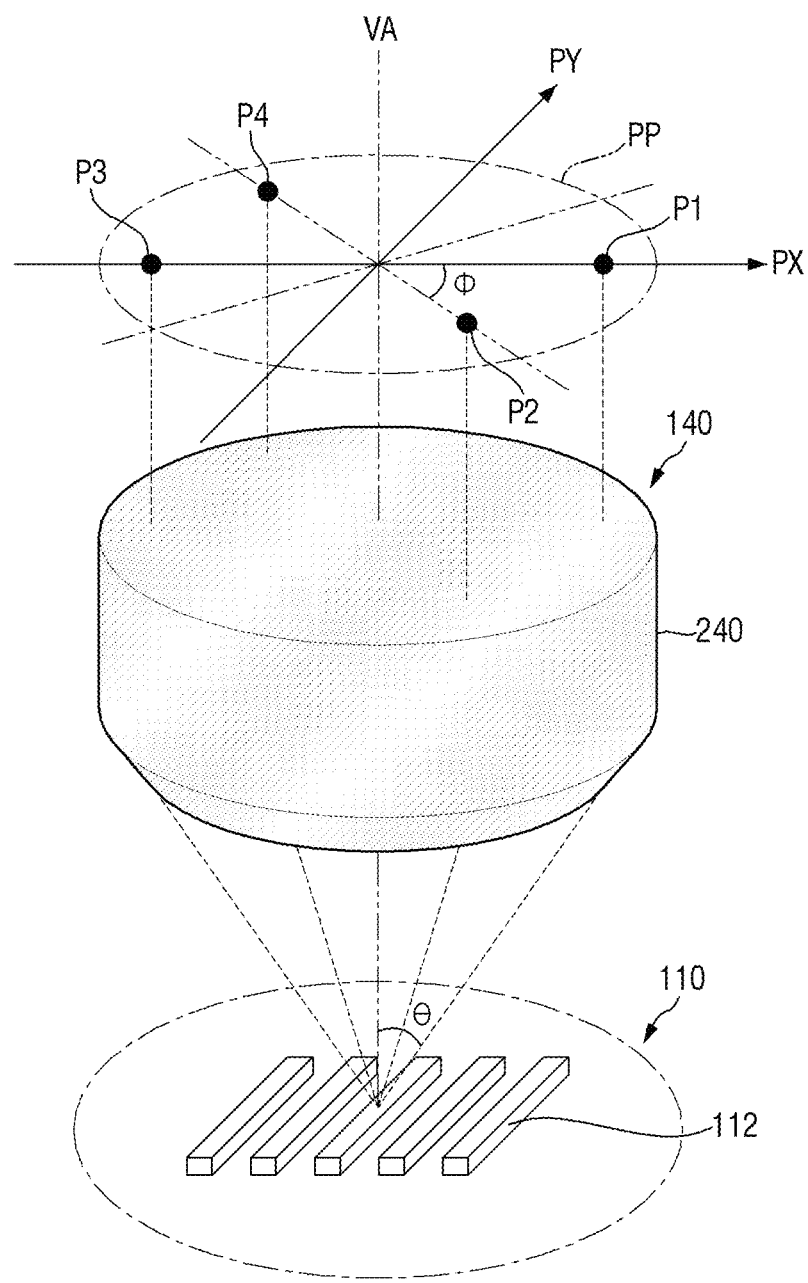
FIG. 2 is a diagram for explaining an optical system of FIG. 1.
Figure 3:
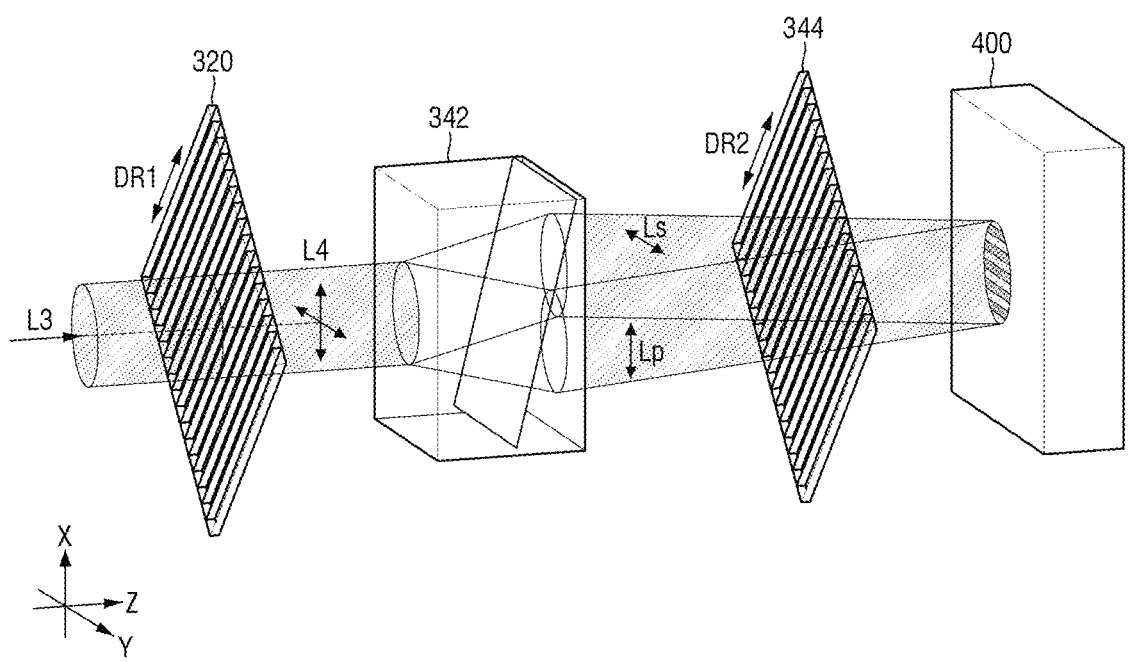
FIG. 3 is a diagram for explaining a self-interference generator of FIG. 1.
Figure 4:
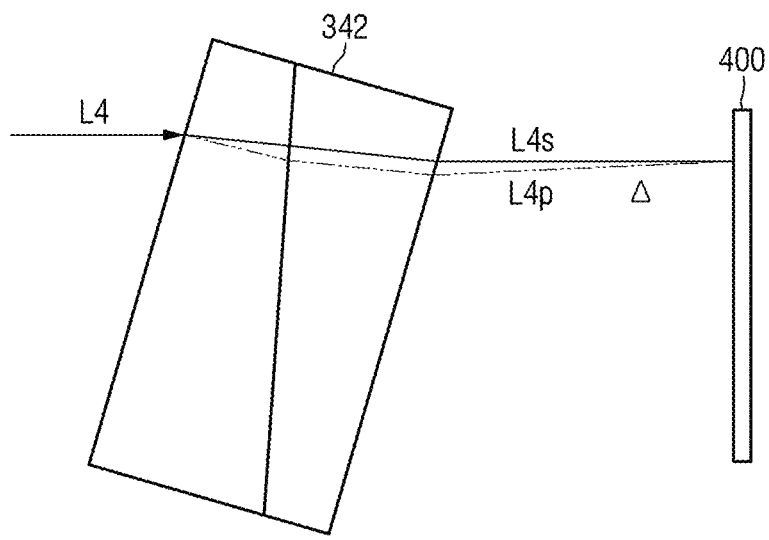
FIG. 4 is a diagram for explaining the self-interference generator of FIG. 1.
Figure 5:
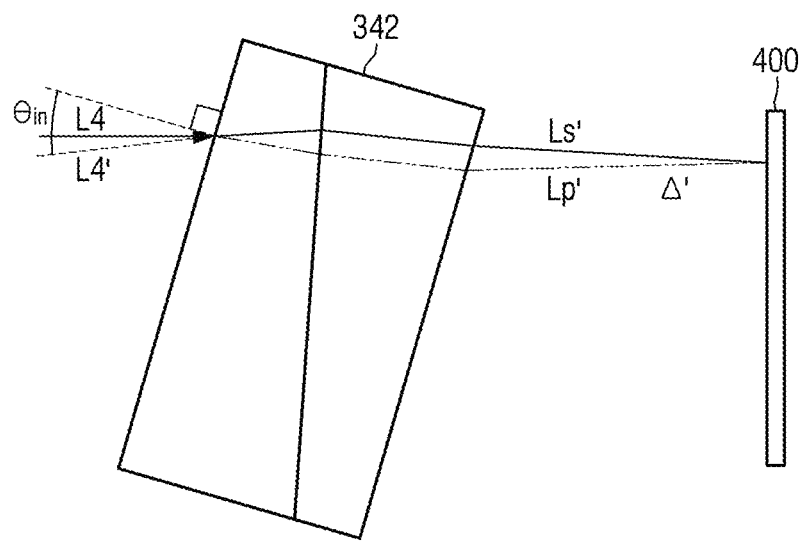
FIG. 5 is a diagram for explaining the self-interference generator of FIG. 1.
Figure 6:
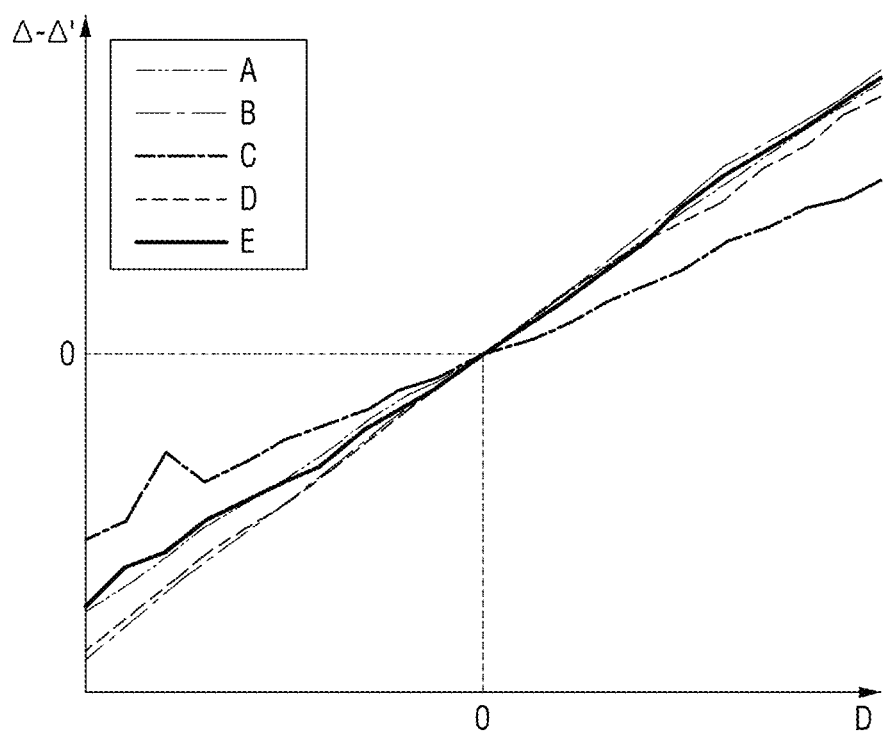
FIG. 6 is a graph showing a difference in a distance between an objective lens and a measurement target from an best focus position of FIG. 1 and a change in a phase difference.

FIG. 1 is a schematic conceptual diagram for explaining an optical measurement apparatus according to some embodiments. FIG. 2 is a diagram for explaining an optical system of FIG. 1. FIGS. 3 to 5 are diagrams for explaining the self-interference generator of FIG. 1. FIG. 6 is a graph showing a difference in a distance between an objective lens and a measurement target from a best focus position of FIG. 1 and a change in a phase difference.

Referring to FIG. 1, the optical measurement apparatus according to some embodiments may include a stage 100, a stage drive unit 120, an optical system 200, a second beam splitter 250, a wavelength selector 310, a polarization selector 320, a relay lens 330, a self-interference generator 340, and a detector 350. As is traditional in the field of the disclosed technology, some features and embodiments are described, and illustrated in the drawings, in terms of functional blocks, units and/or modules, or using ~or or ~er. Those skilled in the art will appreciate from the context that some of these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

The measurement target 110 may be placed on the stage 100. In some embodiments, the stage 100 may be driven by the stage drive unit 120 in a direction DR perpendicular to an upper surface of the stage 100. The stage drive unit 120 is driven by the control of the image analysis unit 360.

The measurement target 110 may include, for example, a pattern 112 as in FIG. 2. When the measurement target 110 is a wafer, the pattern 112 may include various integrated circuits and wirings used for a semiconductor device. The shape of the pattern 112 is not limited to FIG. 2 and may vary. Further, the measurement target 110 may not include the pattern 112. For example, the measurement target 110 may be a bare silicon substrate.

The optical system 200 may generate light and provide the light to the measurement target 110. The optical system 200 may include a light source 210, a lens 220, a first beam splitter 230, and an objective lens 240.

The optical system 200 may be any optical system that generates a pupil image of the measurement target 110. The optical system 200 may be, for example, but is not limited to, a reflective optical system, a transmissive optical system, a refractive optical system, or the like. Hereinafter, the reflective optical system will be described, for example, but the present disclosure is not limited thereto.

The light source 210 may generate and output lights L1 and L1' (e.g., light beams).

In some embodiments, the light source 210 may generate and output broadband (or multi-wavelength) light. The broadband light may be monochromic light including light having a plurality of wavelength bands. The broadband light may have a wide wavelength range, for example, from a wavelength region of ultraviolet rays (e.g., from about 100 nm to about 400 nm) to a wavelength region of infrared rays (e.g., from about 750 nm to about 1,000 μm). The light source 210 may be, for example, but is not limited to, a halogen lamp light source or an LED light source that produces a continuous spectrum light.

In some embodiments, the light source 210 may generate and output the monochromatic light. The monochromatic light may mean light having one wavelength or light having a narrow wavelength range represented by one wavelength (for example, light having a wavelength range of about several nm).

The lens 220 and the first beam splitter 230 may transfer the lights L1 and L1', which are output from the light source 210, to the measurement target 110. The lens 220 may convert the light output from the light source 210 into parallel light and provide it to the first beam splitter 230. The first beam splitter 230 makes the lights L1 and L1' provided from the lens 220 incident toward the measurement target 110, and may provide the reflected lights L2 and L2', which are reflected from the measurement target 110, to the second beam splitter 250. The reflected light L2 is formed by reflection of the light L1 from the measurement target 110, and the reflected light L2' is formed by reflection of the light L1' from the measurement target 110.

The objective lens 240 may condense the lights L1 and L1', which are provided from the first beam splitter 230, on the measurement target 110. The objective lens 240 may be placed so that the lights L1 and L1' are focused on the surface of the measurement target 110. The objective lens 240 may convert the reflected lights L2 and L2' reflected from the measurement target 110 into parallel light and provide it to the first beam splitter 230.

The light L1 indicates that a focus is formed on the surface of the measurement target 110 when a distance between the objective lens 240 and the measurement target 110 is a best focus position, and the light L1' indicates that the focus is formed on the surface of the measurement target 110 when the distance between the objective lens 240 and the measurement target 110 is not the best focus position. When the measurement target 110 is placed at the focus position on the basis of the objective lens 240, the distance between the objective lens 240 and the measurement target 110 may be the best focus position.

The objective lens 240 may provide a pupil image of the measurement target 110. The pupil image of the measurement target 10 means an image of the measurement target 110 formed on a pupil plane PP of the objective lens 240. Here, the pupil plane PP may refer to a back focal plane of the objective lens 240, for example, a plane on an opposite side of the objective lens 240 as the measurement target 110. For example, the objective lens 240 may form the pupil image on the pupil plane PP from the reflected lights L2 and L2' reflected from the measurement target 110.

Referring to FIG. 2, the pupil image of the measurement target 110 formed on the pupil plane PP may include information on various incident angles $\theta$ and azimuths $\phi$.

Here, the incident angle $\theta$ may be defined as an angle formed by light passing through a specific point (for example, a first point P1) on the pupil plane PP and incident on the measurement target 110 and a normal vertical axis (normal VA) perpendicular to an incident interface.

Further, the azimuth $\phi$ may be defined as an angle formed by a reference point on the pupil plane PP (for example, the first point P1) and another point on the pupil plane PP (for example, a second point P2) on the basis of the normal VA. Therefore, the pupil image of the measurement target 110 may have information about various angles at different points (for example, the first to fourth points P1 to P4) on the pupil plane PP.

Referring to FIG. 1 again, the second beam splitter 250 may provide the polarization selector 320 with the reflected lights L2 and L2' provided from the optical system 200. Alternatively, the wavelength selector 310, the polarization selector 320, the relay lens 330, the self-interference generator 340, and the detector 350 are placed on the first beam splitter 230 (e.g., to be aligned along a straight line with the measurement target 110, objective lens 240, and first beam splitter 230), and the polarization selector 320 may be provided with the reflected lights L2 and L2' from the first beam splitter 230. In this case, the second beam splitter 250 may be omitted. The wavelength selector 310 may be placed between the objective lens 240 and the detector 350. The wavelength selector 310 may output at least one monochromatic light among the broadband lights. For example, the wavelength selector 310 may output monochromatic light or any number of monochromatic lights.

In some embodiments, the wavelength selector 310 may be placed between the second beam splitter 250 and the polarization selector 320. The wavelength selector 310 may be provided with the reflected lights L2 and L2' which are broadband lights from the second beam splitter 250. The wavelength selector 310 may output monochromatic lights L3 and L3' among the reflected lights L2 and L2'. The wavelength selector 310 may output the monochromatic light L3 from the reflected light L2 and may output the monochromatic light L3' from the reflected light L2'.

In some embodiments, when the light source 210 outputs the monochromatic light, the wavelength selector 310 may be omitted.

The wavelength selector 310 may include, for example, a band pass filter.

The polarization selector 320 may polarize the reflected lights L2 and L2' at a specific angle or in a specific direction to output polarized lights L4 and L4'. The polarization selector 320 may polarize the reflected light L2 to generate a polarized light L4, and polarize the reflected light L2' to generate a polarized light L4'.

The polarization may include, for example, at least one of a linear polarization, a circular polarization, and an elliptical polarization.

The polarization selector 320 may be placed at various positions depending on the optical measurement apparatus according to some embodiments. In some embodiments, the polarization selector 320 may be placed between the wavelength selector 310 and the self-interference generator 340. The polarization selector 320 may polarize and output the lights L3 and L3' that are output from the wavelength selector 310.

The polarization selector 320 may include, for example, but is not limited to, a polarizer or a polarizing prism.

The relay lens 330 may transfer the polarized lights L4 and L4', which are output from the polarization selector 320, to the self-interference generator 340. The relay lens 330 may include a first lens 331 and a second lens 332. The relay lens 330 may be placed at various positions depending on the optical measurement apparatus according to some embodiments. Further, the relay lens 330 may be omitted depending on the optical measurement apparatus according to some embodiments.

The self-interference generator 340 may generate a self-interference image from the pupil image, using the polarized lights L4 and L4'. The self-interference generator 340 may include a beam displacer 342 and an analyzer 344. The beam displacer 342 may separate the polarized lights L4 and L4' into a plurality of beams L5 and L5', and the analyzer 344 may polarize the plurality of beams L5 and L5'. The polarized lights L6 and L6' may be provided to the image analysis unit 360.

The beam displacer 342 may separate the polarized lights L4 and L4' into a plurality of beams L5 and L5'. The beam displacer 342 may separate, for example, the polarized lights L4 and L4' into two beams. The beam displacer 342 may include or be formed of a material having birefringence (e.g., calcite).

The beam displacer 342 may include or may be a polarizing prism. For example, the beam displacer 342 may include a Nomarski prism, a Wollaston prism, a Rochon prism, and the like. Alternatively, the beam displacer 342 may include or may be, for example, a wave plate.

The analyzer 344 may be placed between the beam displacer 342 and the detector 350. The analyzer 344 may polarize the plurality of beams L5 and L5' separated by the beam displacer 342. The polarized lights L6 and L6' are provided to the image analysis unit 360. The analyzer 344 may cause a plurality of beams separated by the beam displacer 342 to interfere with each other. The plurality of divided beams may interfere with each other to generate a self-interference image for the pupil image.

The analyzer 344 may be, for example, but is not limited to, a polarizer or a polarizing prism.

Specifically, referring to FIG. 3, the polarization selector 320 may polarize the light L3 in the first direction DR1 to output the polarized light L4. The beam displacer 342 may separate the polarized light L4 into a first beam Lp and a second beam Ls. The first beam Lp and the second beam Ls may oscillate in different directions from each other. The first beam Lp may oscillate in a direction rotated by a first angle on the basis of an arbitrary axis, and the second beam Ls may oscillate in a direction rotated at a second angle different from the first angle on the basis of the arbitrary axis.

For example, in one embodiment, the first beam Lp is a polarization component (that is, the p-polarization component) that oscillates in a direction (for example, a p-polarization direction X) that is parallel to the incident surface of the light L3, and the second beam Ls is a polarization component (that is, an s-polarization component) that oscillates in a direction (for example, an s-polarization direction Y) also parallel to the incident surface of the light L3, but perpendicular to the p-polarization direction X. That is, the beam displacer 342 may separate the first beam Lp and the second beam Ls that oscillate in the directions perpendicular to each other.

The analyzer 344 may polarize the first beam Lp and the second beam Ls, which are output from the beam displacer 342, in the second direction DR2 and output them. The first beam Lp and the second beam Ls output from the analyzer 344 may have the same polarization direction as each other. Accordingly, the polarized first beam Lp and the polarized second beam Ls may interfere with each other to generate a self-interference image.

In some embodiments, the second direction DR2 may be the same as the first direction DR1. An angle between a fast axis of the beam displacer 342 and the first direction DR1 may be the same as an angle between the fast axis of the beam displacer 342 and the second direction DR2. The angle may be, for example, 45 degrees.

In some embodiments, the second direction DR2 may differ from the first direction DR1. For example, the angle between the second direction DR2 and the first direction DR1 may be, but is not limited to, 90 degrees. It should be noted that both the polarization selector 320 and the analyzer 344 may be polarizers. Therefore, they may be described as a first polarizer and a second polarizer. Also, though the above description describes the pupil image as being formed as a result of reflection of light from the measurement target, a pupil image can also be formed by transmission of the light generated at the measurement target, or by refraction of the light from the measurement target.

Referring to FIG. 1 again, the detector 350 may generate a two-dimensional (2D) image on the self-interference image generated by the self-interference generator 340. The detector 350 may be, for example, but is not limited to, a CCD (Charge Coupled Device) camera.

For example, when beams divided from the self-interference generator 340 are two (for example, the first beam Lp which is a p-polarization component and the second beam Ls which is an s-polarization component), the self-interference image may include a linear pattern as in FIG. 4. This is merely an example, and it goes without saying that the acquired self-interference image may be various depending on the configuration of the self-interference generator 340.

The image analysis unit 360 may analyze the self-interference image acquired from the detector 350. For example, a self-interference image in the form of a 2D image generated from the detector 350 may be analyzed by the image analysis unit 360.

The image analysis unit 360 may extract phase data from the self-interference image. The image analysis unit 360 may analyze a self-interference image on the pupil image, for example, using Cosine Fitting Functions, a Fourier Transform, a Bucket Algorithm, a Hilbert transform, a Larkin phase extraction method, or the like.

In some embodiments, the image analysis unit 360 may analyze self-interference images, using a domain transform analysis. This will be described in more detail with reference to FIGS. 10 to 14.

The image analysis unit 360 may be, for example, but is not limited to, a PC (Personal Computer), a workstation, a supercomputer, or the like provided with an analysis process. In some embodiments, the image analysis unit 360 is formed integrally with the detector 350 and may form a part of a detector or a detection device.

According to some embodiments, the image analysis unit 360 may generate phase data of the pupil image of the measurement target 110. The image analysis unit 360 may control auto-focusing, by driving the stage drive unit 120 based on, for example, a change in phase data. Alternatively, the image analysis unit 360 may control auto-focusing, by moving the position of the optical system 200, specifically, the objective lens 240, for example, based on the change in the phase data.

Specifically, referring to FIGS. 1 and 4, when the light L4 is incident on the beam displacer 342, the optical paths of the first beam L4$p$ and the second beam L4$s$ vary inside the beam displacer 342, and an optical path difference (OPD) may occur. As a result, a phase difference $\Delta$ may occur.

Referring to FIGS. 1 and 5, when the light L4' is incident on the beam displacer 342, the optical paths of the first beam Lp' and the second beam Ls' vary inside the beam displacer 342, and the optical path difference may occur. Accordingly, a phase difference $\Delta'$ may occur.

For example, when the distance between the measurement target 110 and the objective lens 240 varies from the best focus position, an incident angle $\theta$in of the light L4' incident on the beam displacer 342 varies, and the phase difference changes.

Referring to FIGS. 1, 4, 5 and 6, as difference D in distance between the objective lens 240 and the measurement target 110 increases from the best focus position, the change in phase difference ($\Delta - \Delta'$) may increase. For example, as the difference D in distance between the objective lens 240 and the measurement target 110 increases from the best focus position, the difference D in distance may be proportional to the change in the phase difference ($\Delta - \Delta'$).

A, B, C, D, and E represent different measurement targets 110 from each other. A, B, C, D, and E represent, for example, a measurement target 110 including different patterns from each other. Regardless of the patterns A, B, C, D, and E included in the measurement target 110, as the difference D in distance between the objective lens 240 and the measurement target 110 increases from the best focus position, the change in phase difference ($\Delta - \Delta'$) may increase. Therefore, the image analysis unit 360 may perform auto-focusing on the basis of the change in phase difference ($\Delta - \Delta'$).

The optical measurement apparatus according to some embodiments may improve or enhance measurement sensitivity and measurement consistency, using self-interference images generated from the pupil image. Specifically, the pupil image of the measurement target 110 provided from the optical system 200 may simultaneously include polarization information about various incident angles $\theta$ and azimuths $\phi$. This may provide improved or enhanced measurement sensitivity and measurement consistency, compared to optical measurement apparatus that provides only information about one angle at a time, for example, one incident angle at a time or one azimuth at a time.

The pupil image is not affected by the width of the pattern formed on the measurement target 110, the depth of the pattern, the shape of the pattern, and the like. Therefore, the optical measurement apparatus according to some embodiments may perform auto-focusing irrespective of the measurement target 110. Therefore, it is possible to provide an optical measurement apparatus having improved or enhanced sensitivity of auto-focusing.

The optical measurement apparatus according to some embodiments performs the auto-focusing in accordance with changes in phase data. Therefore, since the auto-focusing is performed irrespective of a DoF (Depth of Focus) of the objective lens, it is possible to provide an optical measurement apparatus having improved or enhanced sensitivity of auto-focusing.

The optical measurement apparatus according to some embodiments performs the auto-focusing using the pupil image, and the pupil image may be provided from the existing optical system. For example, the pupil image may be provided from the existing optical system 200 through the second beam splitter 250 to perform the auto-focusing. Therefore, the optical measurement apparatus according to some embodiments can be configured with a TTL (Through the lens) structure without changing the structure of the existing optical system.

Figure 7:
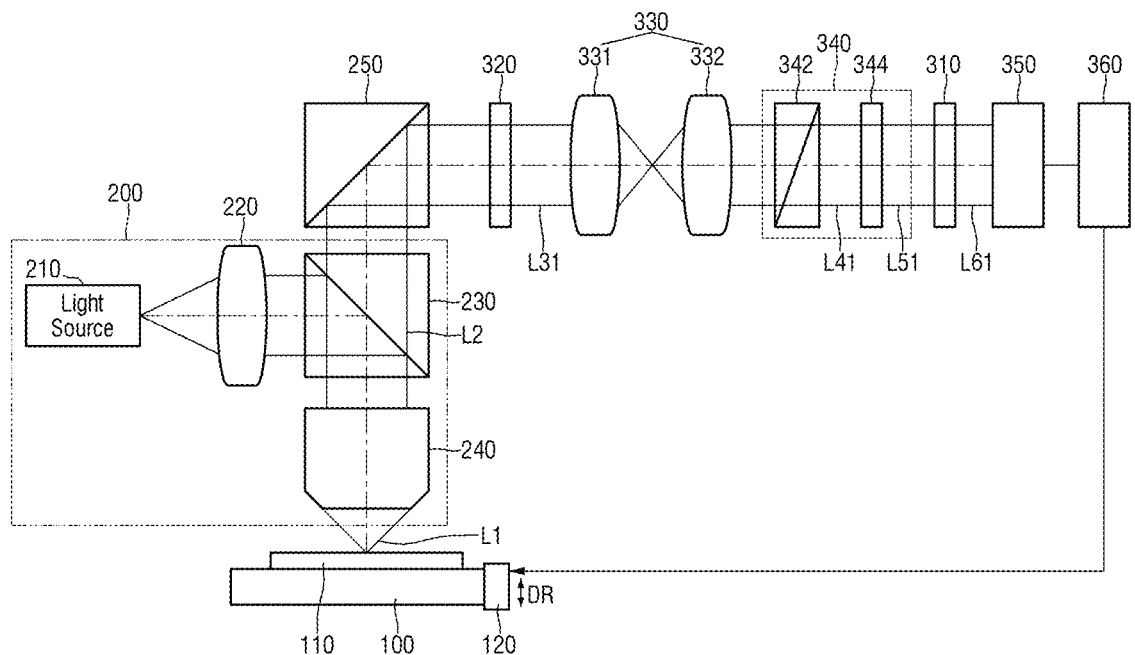
FIG. 7 is a diagram for explaining the optical measurement apparatus according to some embodiments.

FIG. 7 is a diagram for explaining the optical measurement apparatus according to some embodiments. For convenience of explanation, repeated parts of contents described using FIGS. 1 to 6 will be briefly described or omitted.

Referring to FIG. 7, in the optical measurement apparatus according to some embodiments, the wavelength selector 310 may be placed between the self-interference generator 340 and the detector 350.

The reflected light L2 reflected from the measurement target 110 may be provided to the polarization selector 320. The polarization selector 320 may polarize the reflected lights L2 at a specific angle or in a specific direction to output a polarized light L31. The self-interference generator 340 may separate the polarized light L31 into a plurality of beams L41, and may polarize them. The wavelength selector 310 may output a polarized light L61 for monochromatic light among the polarized light L51. Therefore, the detector 350 may receive the self-interference image for monochromatic light.

Figure 8:
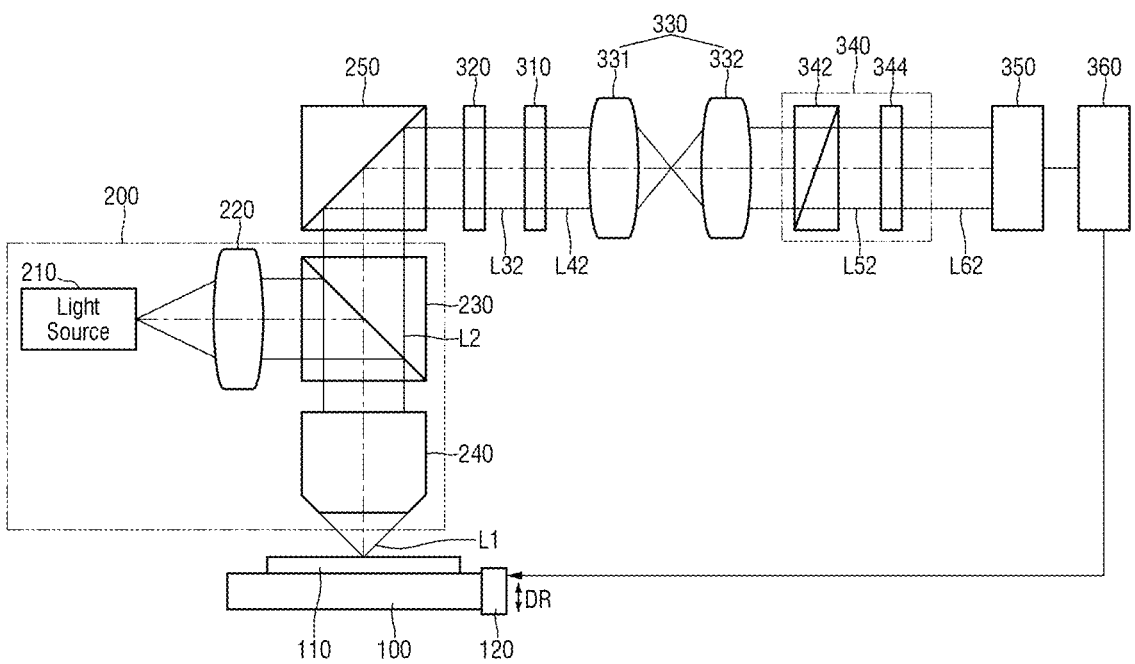
FIG. 8 is a diagram for explaining the optical measurement apparatus according to some embodiments.

FIG. 8 is a diagram for explaining the optical measurement apparatus according to some embodiments. For convenience of explanation, repeated parts of contents described using FIGS. 1 to 6 will be briefly described or omitted.

Referring to FIG. 8, in the optical measurement apparatus according to some embodiments, the wavelength selector 310 may be placed between the polarization selector 320 and the self-interference generator 340.

The reflected light L2 reflected from the measurement target 110 may be provided to the polarization selector 320. The polarization selector 320 may polarize the reflected lights L2 at a specific angle or in a specific direction to output a polarized light L32. The wavelength selector 310 may output a polarized light L42 for the monochromatic light in the polarized light L32.

The self-interference generator 340 may separate the polarized light L42 into a plurality of beams L52, and may polarize the beams L52 to output a polarized light L62. Therefore, the detector 350 may receive the self-interference image for monochromatic light.

FIG. 9 is an exemplary flowchart for explaining the optical measuring method according to some embodiments. For convenience of explanation, repeated parts of contents described using FIGS. 1 to 8 will be briefly described or omitted.

Referring to FIG. 9, a pupil image may be generated (S10).

For example, an objective lens (for example, 240 of FIGS. 1 to 8) that condenses a light source (for example, 210 of FIGS. 1 to 8) and makes it incident on a measurement target (for example, 110 of FIGS. 1 to 8) may be provided. The pupil image may be formed on the pupil plane for such an objective lens. The pupil image may be generated by, for example, the optical system 200 described above using FIGS. 1 to 8.

Subsequently, a self-interference image may be generated, using the pupil image (S20).

For example, a polarization selector (for example, 320 of FIGS. 1 to 8) that polarizes the light source may be provided. The polarized light may be divided into the plurality of beams and the beams are caused to interfere with each other to generate a self-interference image for the pupil image. For example, the plurality of beams may include beams that oscillate in the directions perpendicular to each other. The self-interference image may be generated by, for example, the self-interference generator 340 described above using FIGS. 1 to 8.

Subsequently, the self-interference image may be analyzed (S30).

For example, the generated self-interference image may be analyzed to provide a phase difference for the pupil image (Δ' of FIGS. 1 to 8). The analysis of the self-interference image may be performed by the image analysis unit 360 described above using, for example, FIGS. 1 to 8.

Subsequently, an offset, which is a difference from the best focus position, may be calculated (S40). For example, the phase difference for the best focus position may be determined in advance, and then a variation (e.g., difference) between the phase difference for the best focus position and the phase difference resulting from the analysis may be determined.

For example, the offset (D of FIGS. 1 to 8) may be calculated from a difference in phase difference (Δ−Δ' of FIGS. 1 to 8). The offset may be calculated, for example, by the image analysis unit 360 described above using FIGS. 1 to 8.

Subsequently, the optical measurement apparatus may be moved on the basis of the offset (S50).

For example, using a controller connected to a drive unit of at least one of the stage (100 of FIGS. 1 to 8) and the objective lens 240, at least one of the stage (100 of FIGS. 1 to 8) and the objective lens 240 may be moved on the basis of the offset under the control of the image analysis unit 360. As a result, the distance between the measurement target (110 of FIGS. 1 to 8) and the objective lens may be the best focus position. Accordingly, the auto-focusing may be performed by S40 and S50.

FIG. 10 is an exemplary flowchart for explaining a step of analyzing the self-interference image in the optical measuring method according to some embodiments. FIGS. 11 to 14 are diagrams for explaining a step of analyzing a self-interference image in the optical measuring method according to some embodiments. For convenience of explanation, repeated parts of contents described using FIGS. 1 to 9 will be briefly described or omitted.

Referring to FIG. 10, the analysis (e.g., S30 of FIG. 9) of self-interference images in optical measuring methods according to some embodiments may include usage of the domain transform analysis.

First, the self-interference image may be transformed to generate a transformed image (S31). For example, a 2D Fourier transform on the self-interference image may be performed. Accordingly, a transformed image in which the self-interference image to the pupil image is transformed may be formed.

Figure 11:
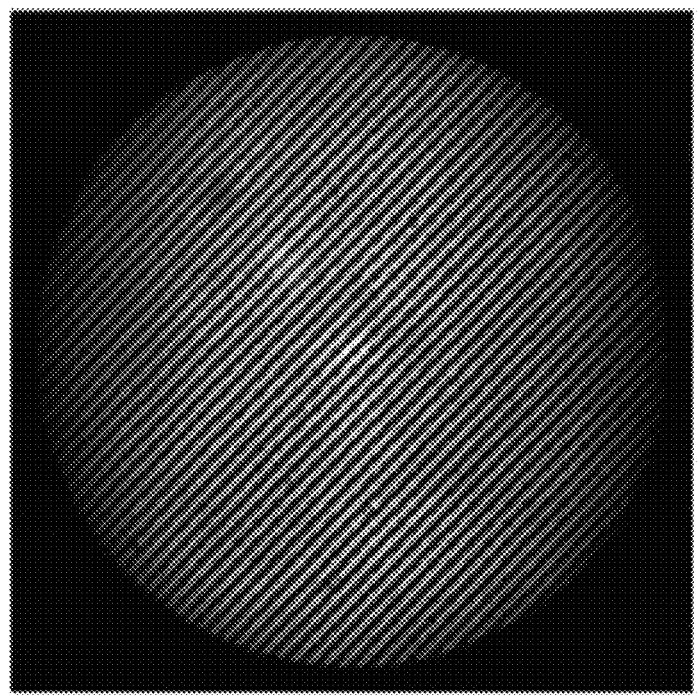
FIG. 11 is a diagram for explaining the step of analyzing the self-interference image in the optical measuring method according to some embodiments.

For example, as shown in FIG. 11, the detector (350 of FIGS. 1 to 8) may generate a 2D image of the self-interference image generated by the self-interference generator (330 of FIGS. 1 to 8). For example, when there are two beams divided from the self-interference generator 340 (for example, the first beam Lp which is a p-polarization component and the second beam Ls which is an s-polarization component), the 2D image generated by the detector 350 for the self-interference image may include a pattern in the form of lines as in FIG. 11. This is merely an example, and it goes without saying that the acquired self-interference image may be various depending on the configuration of the self-interference generator 340.

Figure 12:
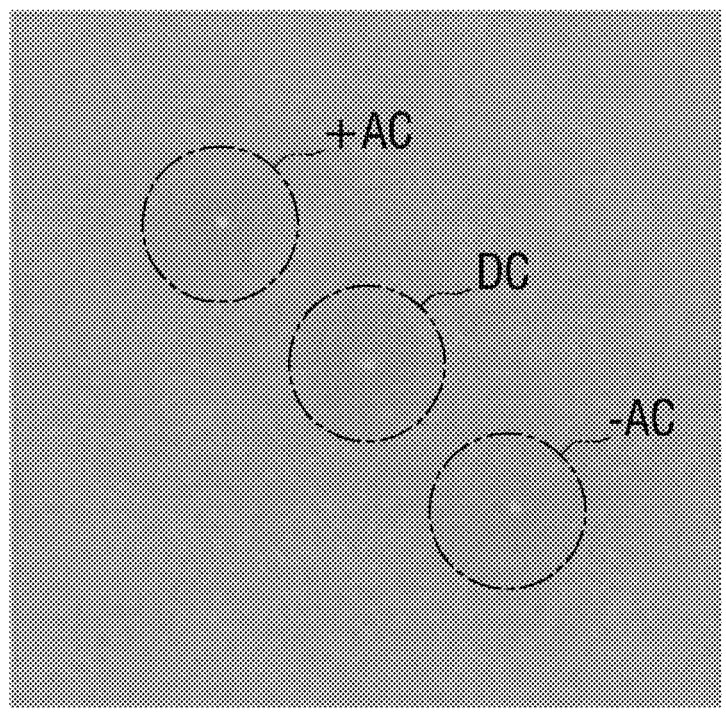
FIG. 12 is a diagram for explaining the step of analyzing the self-interference image in the optical measuring method according to some embodiments.

The transformed image may be generated as shown in FIG. 12, by the 2D Fourier transform of the self-interference image to the pupil image of FIG. 11.

Next, the generated transformed image is separated for each interference to generate a plurality of separated signals (S32). Separation of the transformed image for each interference may be performed, for example, by peak detection, filtering, centering, or the like. This makes it possible to generate a plurality of separated signals in which the transformed images are separated for each interference.

For example, referring to FIG. 12, the transformed image may be separated into a +AC signal, a −AC signal, and a DC signal.

Subsequently, among the plurality of separated signals, the signal including the phase data may be inversely transformed to generate the phase data (S33). For example, a 2D Fourier inverse transform may be performed on the signal including the phase data. Accordingly, the phase data may be generated from the signal.

For example, referring to FIG. 12, the plurality of separated signals may include a +AC signal and a −AC signal including the phase data, and a DC signal including no phase data. Only one signal including the phase data may be left through filtering. That is, either the +AC signal or the −AC signal may be filtered.

Figure 13:
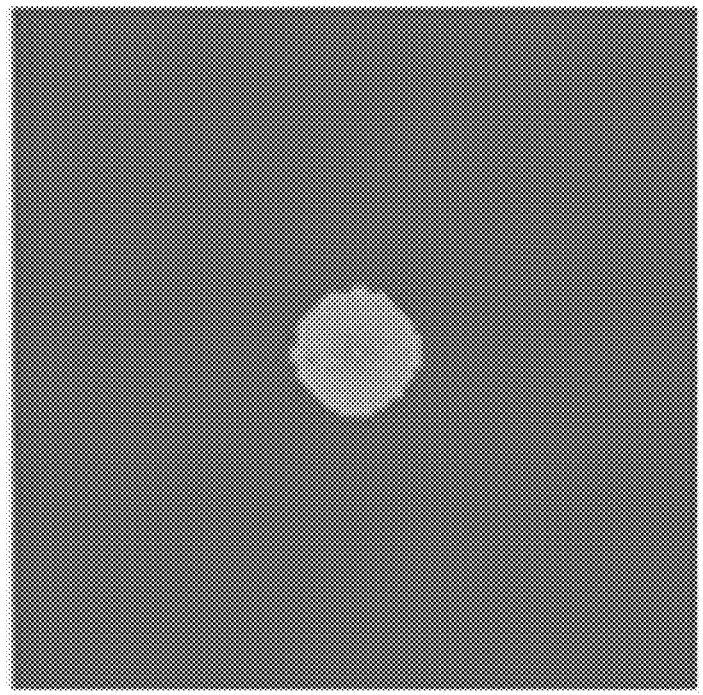
FIG. 13 is a diagram for explaining the step of analyzing the self-interference image in the optical measuring method according to some embodiments.

Next, referring to FIG. 13, the filtered signal may be centered. The filtered signal may be either a +AC signal or a −AC signal.

Figure 14:
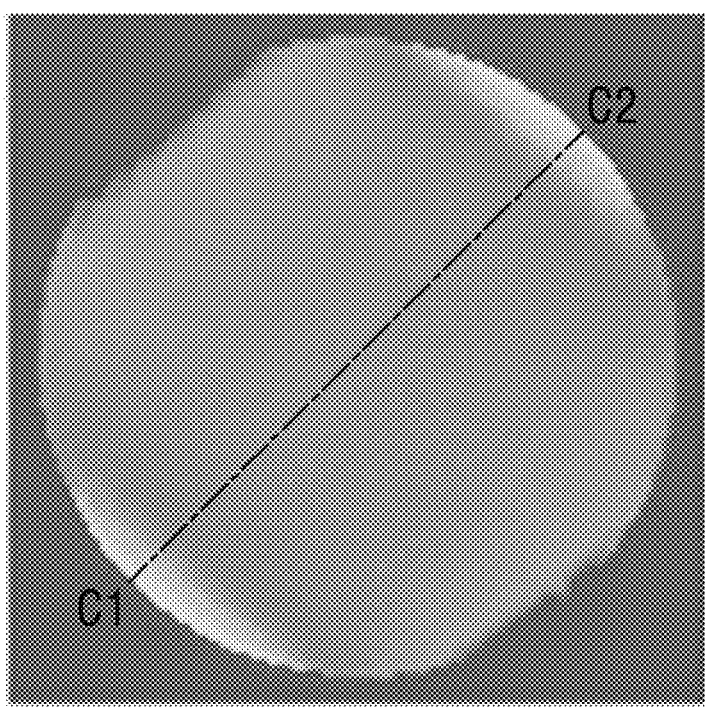
FIG. 14 is a diagram for explaining the step of analyzing the self-interference image in the optical measuring method according to some embodiments.

Next, referring to FIG. 14, the filtered signal may be subjected to an inverse transformation. Accordingly, a pupil image corresponding to the signal may be generated. The pupil image corresponding to the signal may include phase data of various incident angles and azimuths. The phase data may include the phase difference $\Delta'$ of FIGS. 1 to 8.

At this time, since the pupil image includes phase data of various incident angles and azimuths, it is possible to select a point having any one of the incident angles and azimuths. The offset may be calculated, by comparing the phase difference $\Delta'$ at that point with the phase difference $\Delta$ at that point among the pupil images generated according to S31 to S33 in the case of the best focus position (S40 of FIG. 9).

In some embodiments, selection of a point having any one incident angle or azimuth may include selection of a point having a large phase difference $\Delta'$ in the pupil image of FIG. 14. For example, the pupil image of FIG. 14 indicates that a difference in phase difference ($\Delta-\Delta'$) is large in a positive direction toward a red series (that is, the phase difference $\Delta$ is larger than the phase difference $\Delta'$ and the difference is large), and the difference in phase difference ($\Delta-\Delta'$) is large in a negative direction toward a blue series (that is, the phase difference $\Delta'$ is larger than the phase difference $\Delta$ and the difference is large).

In some embodiments, selection of a point having any one incident angle or azimuth may include selection of either a first point C1 or a second point C2 opposite to each other on the basis of the center of the pupil image of FIG. 14. That is, a point on an outline of the pupil image may be selected.

Figure 15:
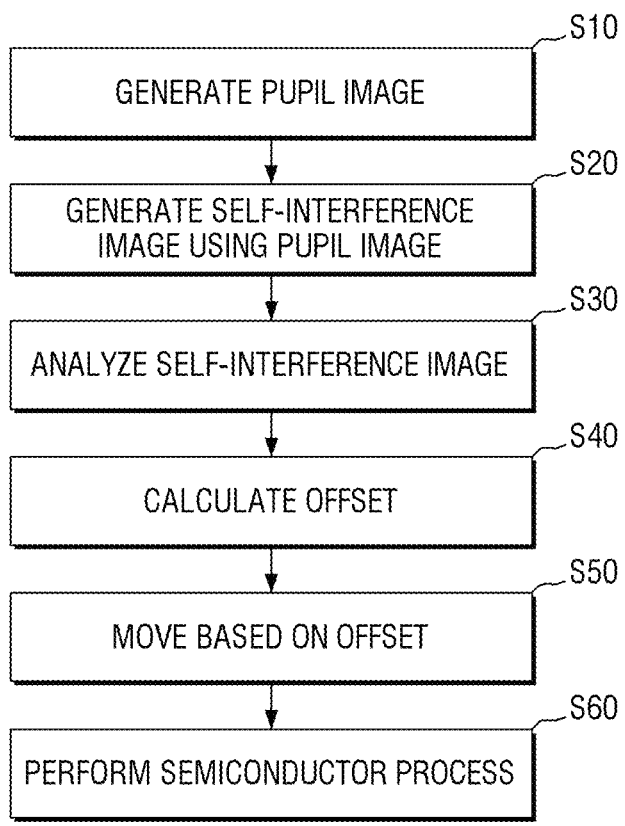
FIG. 15 is an exemplary flowchart for explaining the method for fabricating the semiconductor device according to some embodiments.

FIG. 15 is an exemplary flowchart for explaining the method for fabricating the semiconductor device according to some embodiments. For convenience of explanation, repeated parts of contents described using FIGS. 1 to 14 will be briefly described or omitted.

Referring to FIG. 15, a pupil image is generated (S10), a self-interference image is generated using the pupil image (S20), the self-interference image is analyzed (S30), and an offset which is a difference from the best focus position is calculated (S40), and the optical measurement apparatus may be moved on the basis of the offset (S50). Accordingly, the auto-focusing may be performed. Since the steps of S10 to S50 are substantially the same as those described above using FIGS. 9 to 14, the detailed description will not be provided below.

Subsequently, the semiconductor process on the measurement target may be performed (S60). For example, when the measurement target is a wafer, a semiconductor process on the wafer may be performed. The semiconductor process on the wafer may include, but is not limited to, for example, a deposition process, an etching process, an ion process, a cleaning processes, or the like. For example, based on the new positioning of the optical measurement apparatus for proper auto-focusing, certain processes can be carried out. The measurement of finding a proper focus distance between the measurement target 110 (e.g., wafer) and the objective lens 240 may be used, for example, to more accurately align manufacturing equipment with the wafer, for verifying that a prior manufacturing process was carried out correctly, for photolithography purposes, or for other processes. For example, the measurement may be used to form a properly focused image of the wafer, and to use the image for the above processes. As the semiconductor process on the wafer is performed, the integrated circuits and wirings required for the semiconductor device may be formed. The semiconductor process on the wafer may include a test process on a semiconductor device of a wafer level.

When the semiconductor chips are completed in the wafer through the semiconductor process on the wafer, the wafer may be individualized into a plurality of individual semiconductor chips. Individualization to each semiconductor chip may be achieved through a sawing process by a blade or a laser. After that, a packaging process on each semiconductor chip may be performed. The packaging process may mean a process of mounting each semiconductor chip on a circuit board (for example, a printed circuit board (PCB)) and sealing it with a sealing material. Further the packaging process may include a process of stacking a plurality of chips on the circuit board into multi-layers to form a stack package, or stacking the stack package on another stack package to form a package-on-package (POP) structure. The semiconductor package may be formed through the packaging process on each semiconductor chip. The semiconductor process on the wafer may include a test process on the semiconductor device of the package level. The term "semiconductor device" may refer to a single semiconductor chip or stack of semiconductor chips, a semiconductor package, or a package-on-package device.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. An optical measurement apparatus comprising:
an optical system including an objective lens which generates a pupil image of a measurement target, using light;
a polarization generator which generates a polarized light from the light;
a self-interference generator which generates a plurality of beams divided from the pupil image, using the polarized light, and causes the plurality of beams to interfere with each other to generate a self-interference image;
a detector which detects the self-interference image; and
an image analysis unit configured to extract phase data from the self-interference image, and to move the measurement target to a focus position on the basis of the phase data,
wherein the polarization generator and the self-interference generator are both optically between the objective lens and the detector.

2. The optical measurement apparatus of claim 1, wherein the image analysis unit is configured to:
calculate a difference between a phase included in the phase data and a phase included in phase data when the measurement target is in the focus position, and
move the measurement target to the focus position on the basis of the difference.

3. The optical measurement apparatus of claim 1, wherein:
the polarization generator polarizes the light in a first direction to generate the polarized light, and
the image analysis unit is configured to polarize the plurality of beams in the first direction or a second direction different from the first direction to cause the plurality of beams to interfere with each other.

4. The optical measurement apparatus of claim 3, wherein the second direction is perpendicular to the first direction.

5. The optical measurement apparatus of claim 1, wherein the image analysis unit is configured to utilize an image analysis or a domain transform analysis to extract the phase data from the self-interference image.

6. The optical measurement apparatus of claim 1, wherein the optical system generates the pupil image of the measurement target using any one of: a light formed by reflection of the light from the measurement target, a light formed by transmission of the light from the measurement target, and a light formed by refraction of the light from the measurement target.

7. The optical measurement apparatus of claim 1, wherein:
the light includes broadband light, and
the image analysis unit is configured to extract the phase data from the self-interference image generated using at least one monochromatic light of the broadband light to extract the phase data from the self-interference image.

8. An optical measurement apparatus comprising:
a light source which generates light;
an optical system including an objective lens which converts light generated by the light source and received from a measurement target into parallel light and outputs the parallel light to output a pupil image of the measurement target;
a polarization generator which generates a polarized light from the parallel light;
a self-interference generator which generates a plurality of beams divided from the pupil image, using the polarized light;
a detector which detects a self-interference image generated by the plurality of beams interfering with each other; and
an image analysis unit configured to extract phase data from the self-interference image and adjust a distance between the measurement target and the optical system on the basis of the phase data.

9. The optical measurement apparatus of claim 8, wherein:
the light includes a broadband light, and
the optical measurement apparatus further comprises a wavelength selector which is disposed between the optical system and the detector to output at least one monochromatic light of the broadband light.

10. The optical measurement apparatus of claim 8, wherein the optical system generates the pupil image, using any one of a light formed by reflection of the light from the measurement target, a light formed by transmission of the light from the measurement target, and a light formed by refraction of the light from the measurement target.

11. The optical measurement apparatus of claim 8, wherein the polarization generator and the self-interference generator each include a polarizer that polarizes incident light in a first direction.

12. The optical measurement apparatus of claim 11, wherein:
the self-interference generator includes a polarizing prism, and
the first direction is a direction that is rotated by a first angle with respect to a fast axis of the polarizing prism.

13. The optical measurement apparatus of claim 8, wherein:
the polarization generator includes a first polarizer that polarizes in a first direction, and
the self-interference generator includes a second polarizer that polarizes in a second direction different from the first direction.

14. The optical measurement apparatus of claim 8, wherein the plurality of beams include a first beam and a second beam that oscillate in directions rotated by different angles from each other with respect to a first axis.

15. The optical measurement apparatus of claim 8, wherein the image analysis unit is configured to extract the phase data, using an image analysis or a domain transform analysis through image processing.

16. The optical measurement apparatus of claim 8, wherein the image analysis unit is configured to extract the phase data of points having an arbitrary incident angle and an arbitrary azimuth in the self-interference image.

17. An optical measurement apparatus comprising:
a light source which generates light including a broadband light;
a beam splitter which makes the light incident on a measurement target, and emits any one of light reflected from the measurement target, light transmitted from the measurement target, and light refracted from the measurement target;
an objective lens which condenses the light from the measurement target and generates a pupil image of the measurement target from the light from the measurement target, wherein the objective lens is between the measurement target and the pupil image;
a wavelength selector which receives the light from the objective lens and which outputs at least one monochromatic light from the light received from the objective lens, wherein the light received from the object lens is parallel light;

a polarization generator which polarizes the monochromatic light in a first direction to generate a polarized light;

a self-interference generator which includes a beam displacer that generates a plurality of beams divided from the pupil image by the use of the polarized light, and an analyzer that polarizes the plurality of beams in a second direction;

a detector which detects a self-interference image generated by the plurality of beams interfering with each other; and an image analysis unit configured to extract a phase difference from the self-interference image, and adjust a distance between the measurement target and the objective lens on the basis of the phase difference, wherein the wavelength selector, polarization generator, and self-interference generator are all optically between the objective lens and the detector.

18. The optical measurement apparatus of claim 17, wherein the beam displacer generates a first beam and a second beam that oscillate in directions rotated by different angles with respect to a first axis.

19. The optical measurement apparatus of claim 17, wherein the first direction and the second direction are different directions from each other or directions rotated by a first angle with respect to a fast axis of the beam displacer.

20. The optical measurement apparatus of claim 17, wherein the image analysis unit is configured to extract the phase difference from the self-interference image, using an image analysis or a domain transform analysis.

* * * * *